United States Patent [19]
Vyne et al.

[11] Patent Number: 5,140,280
[45] Date of Patent: Aug. 18, 1992

[54] RAIL-TO-RAIL OUTPUT STAGE OF AN OPERATIONAL AMPLIFIER

[75] Inventors: Robert L. Vyne; Thomas D. Petty, both of Tempe, Ariz.; Rikki Koda, Cambridge, Mass.

[73] Assignee: Motorola, Inc., Schaumburg, Ill.

[21] Appl. No.: 753,129

[22] Filed: Aug. 30, 1991

[51] Int. Cl.⁵ .............................................. H03F 3/45
[52] U.S. Cl. .................................... 330/255; 330/267
[58] Field of Search ......................... 330/255, 267, 268

[56] References Cited

U.S. PATENT DOCUMENTS 4,524,330  6/1985  Burgyan .......................... 330/255 X
4,990,863  2/1991  Susak et al. ........................... 330/267

*Primary Examiner*—James B. Mullins
*Attorney, Agent, or Firm*—Robert D. Atkins

[57] ABSTRACT

An input stage of an operational amplifier uses current sources to allow first and second differential input transistor pairs to operate near the power supply rails. The output stage of the operational amplifier also operates within a saturation potential of the power supply rails. The first differential input transistor pair operates when the input signal is less than a predetermined threshold, while the second differential input transistor pair operates when the input signal is greater than the predetermined threshold. A detection circuit at the input terminals prevents phase inversion of the output signal should the inputs be driven beyond the power supply rails. A current cancellation circuit removes current variation induced by voltage changes at the output of the input stage and provides high gain and low input offset voltage.

9 Claims, 2 Drawing Sheets

RAIL-TO-RAIL OUTPUT STAGE OF AN OPERATIONAL AMPLIFIER

CROSS REFERENCE TO RELATED PATENT APPLICATION

This application is related to copending U.S. patent application 07/753,128, entitled "RAIL-TO-RAIL INPUT STAGE OF AN OPERATIONAL AMPLIFIER", filed Aug. 30, 1991, by Rikki Koda et al with at least one inventor in common and assigned to the same assignee, Motorola, Inc.

BACKGROUND OF THE INVENTION

This invention relates in general to operational amplifiers and, more specifically, to a rail-to-rail output stage of an operational amplifier.

Operational amplifiers are found in a myriad of applications in electronic circuit design for amplifying and/or buffering an input signal and providing an output signal. One desirable feature of an operational amplifier is the ability to drive an input signal between the positive and negative power supply rails ($V_{CC}$ and $V_{EE}$). This feature is especially important when configuring the operational amplifier as a voltage follower with the output hard-wired back to the inverting input terminal while the input signal drives the non-inverting input terminal. With the output signal of the operational amplifier swinging rail-to-rail, the input terminals must accommodate the same dynamic range.

Most operational amplifiers are limited in the dynamic range of the input signal, and the output signal, to a value somewhat less than the power supply rails, say 800 millivolts (mv) less. In applications involving relatively low operating potentials on the power supply conductors, say three volts between $V_{CC}$ and $V_{EE}$, the 800 mv overhead limits the operating range of the input signal to 1.4 volts (3.0-0.8-0.8). A similar narrow operating range is a problem for the output signal of the operational amplifier. Such a narrow dynamic range is unacceptable in many applications.

Hence, what is needed is an operational amplifier having an input stage and an output stage each capable of processing signals operating substantially at the power supply rails.

SUMMARY OF THE INVENTION

Briefly stated, the invention comprises an operational amplifier including an input stage responsive to first and second input signals for developing a control signal at an output which is applied to an output stage for providing an output signal of the operational amplifier at an output. The output stage comprises a first transistor having an emitter coupled to a first source of operating potential, and a second transistor having a collector coupled to the collector of the first transistor for providing the output signal of the operational amplifier, an emitter coupled to a second source of operating potential and a base coupled for receiving the control signal from the input stage. A circuit is responsive to the control signal from the input stage for regulating a drive signal applied to the base of the first transistor to allow the output signal of the operational amplifier to swing substantially between the first and second sources of operating potentials.

DETAILED DESCRIPTION OF THE PREFERRED EMBODIMENT

Figure 1:
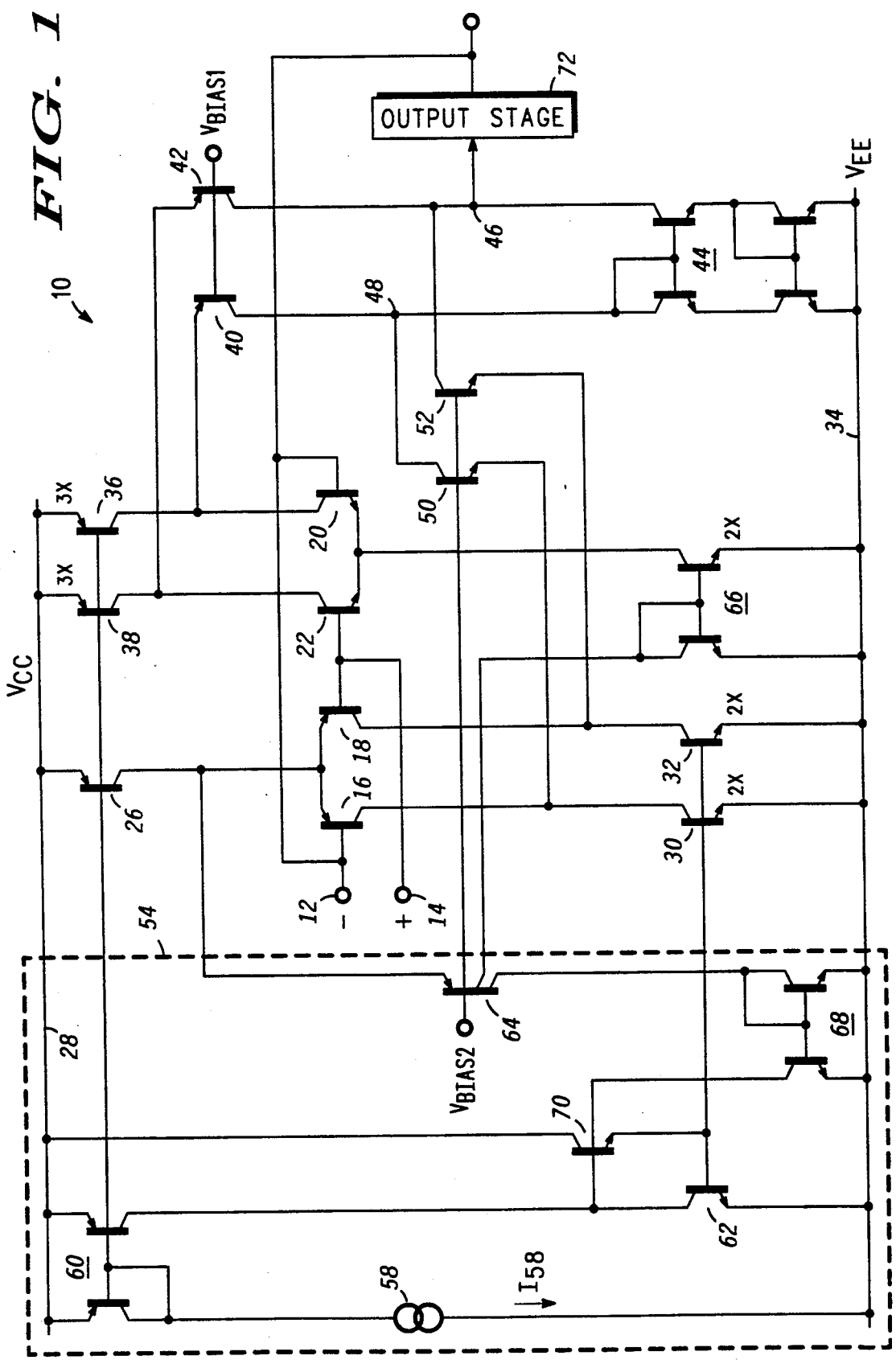
FIG. 1 is a schematic and block diagram illustrating an input stage and an output stage of an operational amplifier.

A rail-to-rail input stage 10 of an operational amplifier is shown in FIG. 1 having inverting and non-inverting input terminals 12 and 14 coupled to the bases of differential PNP transistors 16 and 18, respectively. Terminals 12 and 14 are also coupled to the bases of differential NPN transistors 20 and 22. The common emitters of transistors 16 and 18 are coupled through current source transistor 26 to power supply conductor 28 operating at a positive potential such as $V_{CC}$. The collectors of transistors 16 and 18 are coupled through current source transistors 30 and 32, respectively, to power supply conductor 34 operating at a negative potential such as $V_{EE}$, or possibly ground potential. Likewise, the collectors of transistors 20 and 22 are coupled through current source transistors 36 and 38 to power supply conductor 28.

Transistors 36, 38, 40 and 42 form a pair of cascode current sources coupled between power supply conductor 28 and current mirror circuit 44, which is configured as a modified-Wilson current mirror, for providing an output signal of input stage 10 at node 46. Node 48 is located at the interconnection of the collector of transistor 40 and the input of current mirror circuit 44. The bases of transistors 40 and 42 receive bias potential $V_{BIAS1}$ operating at $V_{CC}-V_{be}-V_{SAT}$, where $V_{be}$ is the base-emitter junction potential of transistors like 40-42, say 700 mv, and $V_{SAT}$ is the collector-emitter saturation potential of current source transistors 36-38, say 100 mv. Transistors 30, 32, 50 and 52 also form a pair of cascode current sources coupled between power supply conductor 34 and current mirror circuit 44. The use of current source transistors 30-32 and 36-38 operating at, or near, saturation allows the collector voltages of transistors 16-22 to approach the respective power supply conductors.

Circuit 54 controls the operation of transistors 16-18 and 20-22 such that the switching transistor pairs conduct in a mutually exclusive manner, depending on the input DC bias level, and permit rail-to-rail input signals at terminals 12 and 14. Current source 58 sinks a current $I_{58}$ of predetermined magnitude, say 20 microamps (μa), through the input of current mirror circuit 60 and reflects the same current through the collector-emitter conduction path of transistor 26. The output of current mirror circuit 60 is coupled to the collector of transistor 62 which includes an emitter coupled to power supply conductor 34. Transistor 64 has an emitter coupled to the collector of transistor 26, and first and second collectors coupled to the inputs of current mirror circuits 66 and 68, respectively. The base of transistor 64 receives bias potential $V_{BIAS2}$ operating at $V_{EE}+V_{be}+V_{SAT}$. The output of current mirror circuit 66 is coupled to the common emitters of transistors 20 and 22, while the output of current mirror circuit 68 is coupled to the base of transistor 70 and to the collector of transistor 62. Transistor 70 also includes a collector coupled to power supply conductor 28 and an emitter coupled to the common bases of transistors 30, 32 and 62, forming a current mirror circuit with an input at the collector of transistor 62 and first and second outputs at the collectors of transistors 30-32, respectively.

The potential developed at node 46 is applied to output stage 72 which provides the output voltage of the operational amplifier, inverted with respect to the voltage at node 46. Further detail of output stage 72 is forthcoming. For now, it is sufficient to understand that the output voltage of output stage 72 is capable of swinging substantially rail-to-rail in response to the input signals applied at terminals 12 and 14. The output signal of output stage 72 is applied back to inverting terminal 12 to configure the operational amplifier as a voltage follower.

First consider the DC operation of input stage 10 where a low potential is applied at terminal 14 equal to the negative power supply rail. Transistors 16-18 operate when the input signal is below a predetermined threshold $V_{EE}+V_{SAT}+V_{be}$, that is, in a range between approximately 800 mv above the negative power supply rail to approximately 100 mv below the negative power supply rail. Transistors 20-22 handle input signals above the predetermined threshold, between $V_{EE}+V_{SAT}+V_{be}$ and the positive power supply rail.

Using transistors 30-32 and 36-38 as current sources is a key feature of the present invention since it develops minimal potentials $V_{SAT}$ across the collector-emitter junctions thereof and allows the input signals to operate near the power supply rails. Transistors 40-42 and 50-52 are cascoded with transistors 36-38 and 30-32, respectively, to increase the impedance at nodes 46-48 and provide high gain.

Whenever the input voltages on terminals 12 and 14 are below $V_{EE}+V_{SAT}+V_{be}$, transistors 16 and 18 are conducting and transistor 64 is in a non-conductive state. Current mirror circuits 66 and 68 are also both off as are transistors 20 and 22 since zero current flows through transistor 64.

A 20 μa current $I_{SS}$ is mirrored through current mirror circuit 60 and flows through transistor 62. Another 20 μa current flows through transistor 26 and splits between transistors 16-18. Transistors 30-32 are 2× devices, that is, each has an emitter area of two times the emitter area of transistor 62 and therefore conduct two times the current (40 μa) given a similar $V_{be}$. Transistors 36-38 are 3× devices and conduct three times the current (60 μa) as transistor 26. Thus, 60 μa of current flows through each of transistors 40-42 since transistors 20-22 are off. The difference between the 10 μa of current flowing through each of transistors 16-18, and the 40 μa of current flowing through each of transistors 30-32 is drawn through transistors 50-52 thereby subtracting from the 60 μa in transistors 36-38 and leaving 30 μa in each side of current mirror circuit 44.

As the potential at terminal 14 increases, less current flows through transistors 16-18 and the potential at the collector of transistor 26 increases until transistor 64 turns on. The collector potential of transistor 26 is clamped at one $V_{be}$ above bias potential $V_{BIAS2}$. Transistors 16-18 are turned off by the reverse bias across their junctions. The 20 μa current flowing through transistor 26 is routed through transistor 64 where it is split between the first and second collectors thereof (10 μa each). Current mirror circuit 68 sinks 10 μa of current which is drawn away from the collector of transistor 62, thereby reducing the $V_{be}$ of transistor 62 and causing transistors 30-32 to conduct only 20 μa of current each.

The output transistor of current mirror circuit 66 is a 2× device and sinks a 20 μa current via the 10 μa flowing through the first collector of transistor 64. Transistors 20-22 combine to conduct 20 μa of current drawn by current mirror circuit 66. Since transistors 36-38 continue to source 60 μa currents, transistors 40-42 each conduct 50 μa of current. Transistors 30-32 are presently sinking 20 μa currents drawn through transistors 50-52, again leaving 30 μa of current flowing through current mirror circuit 44. The DC operation of input stage 10 is thus balanced with 30 μa of current flowing through each side of current mirror circuit 44 irrespective of which switching transistor pair 16-18 or 20-22 is conducting. Input stage 10 continues to operate with input signals up to one $V_{SAT}$ above the positive power supply rail.

The above description covered the DC operation of input stage 10. Any AC signal applied at terminals 12 and/or 14 is routed through transistors 16-18 or 20-22, depending on the DC bias, and continues through the folded cascode current source transistors 40-42 or 50-52. The cascode current source transistors 36-38 and 40-42 between nodes 46-48 and power supply conductor 28, and similarly cascode current source transistors 30-32 and 50-52 between nodes 46-48 and power supply conductor 34, provide high impedance at nodes 46 and 48 which produces the high gain for the AC signal.

Figure 2:
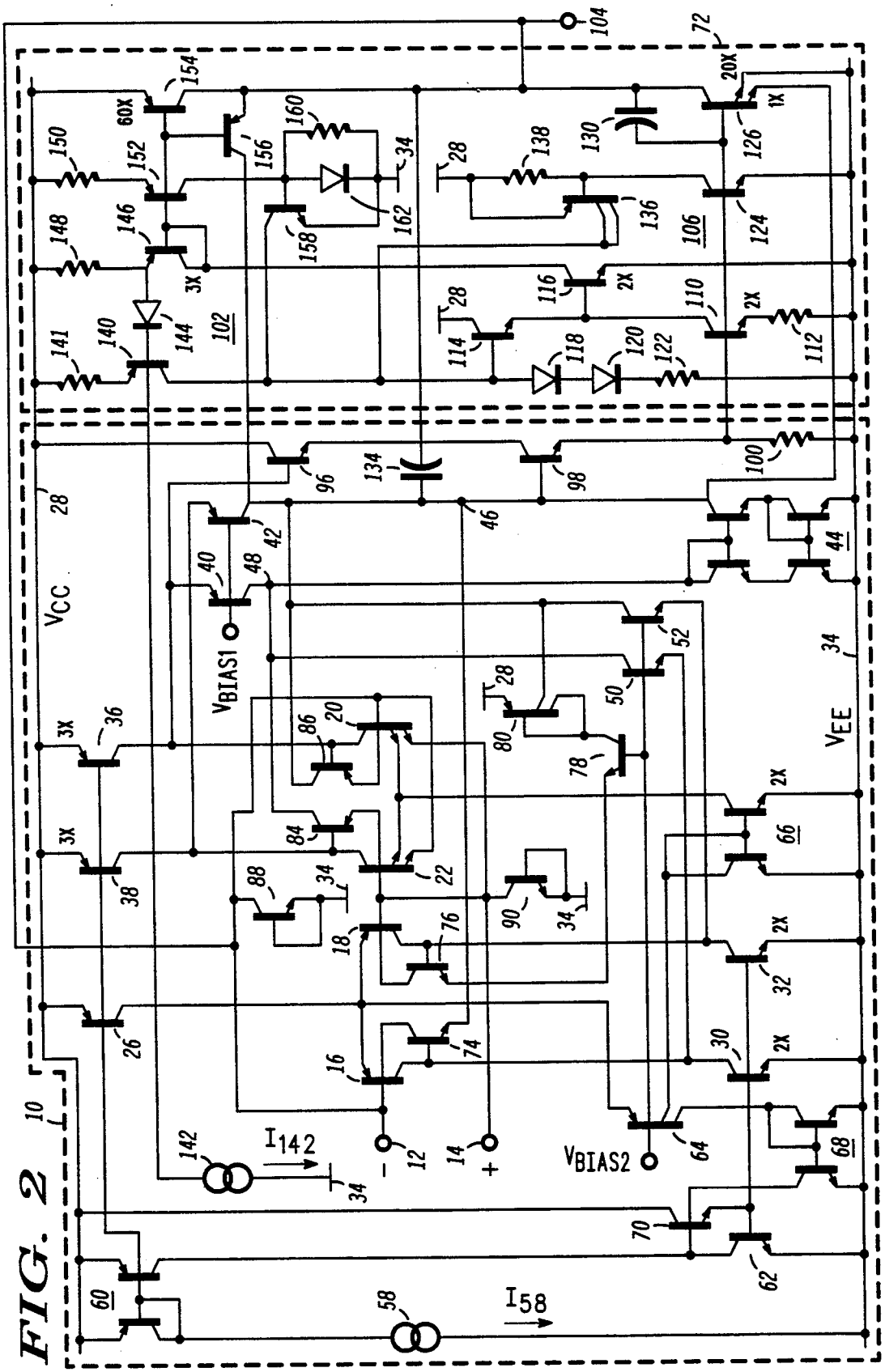
FIG. 2 is a schematic diagram illustrating further detail of the input stage and output stage of FIG. 1.

A common problem in prior art operational amplifiers is a phase inversion of the output signal should the input signals exceed the respective power supply rails. Turning to FIG. 2, additional features are shown for input stage 10 including a detection circuit coupled to terminals 12 and 14 for preventing undesirable phase inversion of the output signal should the magnitude of the input signals exceed the positive or negative power supply rail. Components having a similar function are labeled with the same reference numbers used in FIG. 1.

As part of the detection circuit, transistors 74 and 76 have collectors coupled to terminals 12 and 14, respectively, and bases coupled to the collectors of transistors 16 and 18 for detecting the onset of saturation of transistors 16 and 18 to prevent phase inversion of the output signal. The emitter of transistor 74 is coupled to node 46, while the emitter of transistor 76 is coupled through transistor 78 to the base and first collector of transistor 80. Transistor 80 also includes an emitter coupled to power supply conductor 28 and a second collector coupled to node 46 for providing a current mirror operation, wherein the current drawn through transistor 78 also flows into node 46.

Consider a low potential applied at terminal 12 less than the negative power supply rail, ignoring the voltage follower configuration of the operational amplifier for the moment. When transistor 16 begins to saturate from the low input signal, transistor 74 turns on and draws current from node 46 into terminal 12. Transistors 74 and 76 are biased in inverse-active mode, wherein current flows from the emitter to the collector. The potential at node 46 falls from the current drain, causing the output voltage of the operational amplifier to rise toward the positive power supply rail due to the inverting behavior of output stage 72. Thus, a low signal less than the negative power supply rail at inverting input terminal 12 (double inversion) forces the output signal of the operational amplifier to the positive power supply rail.

Similarly, a low potential at terminal 14, less than the negative power supply rail, turns on transistor 76 and sinks current through transistors 78 and 80 into terminal 14. The same magnitude of current flowing from the first collector of transistor 80 also flows through the second collector of the same into node 46. The potential at node 46 increases and switches the output voltage of the operational amplifier to the negative power supply rail, as one would expect for a negative signal applied at non-inverting input terminal 14.

Input stage 10 also includes transistors 84 and 86 for detecting the onset of saturation of transistors 20 and 22 when terminals 12 and 14 are driven beyond the positive power supply rail, respectively. The emitters of transistors 84 and 86 are coupled to terminals 14 and 12, respectively, and the bases of transistors 84 and 86 are coupled to the collectors of transistors 22 and 20. The collectors of transistors 84 and 86 are coupled to nodes 48 and 46, respectively. Transistors 20 and 22 also include second emitters coupled to terminals 14 and 12 and operating as a diode which, in combination with series input resistors (not shown), protect the input base-emitter junctions from zenering. Transistors 88 and 90 are provided for ESD protection from extremely high voltages at terminals 12 and 14.

Should the input signal at terminal 12 exceed the positive power supply rail, transistor 86 senses the saturation of transistor 20 and sources current into node 46 which drives the output signal of the operational amplifier to the negative power supply rail. Alternately, an input signal at terminal 14 greater than the positive power supply rail saturates transistor 22 which turns on transistor 84 and sources current into current mirror circuit 44 where it is turned around to draw current away from node 46. The potential at node 46 decreases and the output signal of the operational amplifier is driven to the positive power supply rail.

Another feature illustrated in FIG. 2 is current cancellation provided by transistor 96. The base of transistor 96 is coupled to the collector of transistor 20, and the base of transistor 98 is coupled to node 46. The collector of transistor 96 is coupled to power supply conductor 28 and its emitter is coupled to the collector of transistor 98. The emitter of transistor 98 is coupled through resistor 100 to power supply conductor 34. Therefore, transistors 96 and 98 conduct substantially the same current.

Any voltage change at node 46 from a change in the input signal produces a $\Delta I$ current flowing into the base of transistor 98, where it is amplified by the forward current gain $\beta$. The current flowing through transistor 98 changes by $\beta \Delta I$. The base current of transistor 96 increases by $$\left( \frac{\beta \Delta I}{\beta + 1} \right)$$

since the same $\beta \Delta I$ flows through its emitter. Transistor 40 conducts approximately $\Delta I$ less current and current mirror circuit 44 sinks $\Delta I$ less current. The output of current mirror circuit 44 also sinks approximately $\Delta I$ less current which effectively cancels the original $\Delta I$ current induced by the voltage change at node 46 into the base of transistor 98. Thus, AC variation in voltage at node 46 produce near zero current change. This in combination with the high impedance provided by the folded cascode current sources 36-42 and 30-32 and 50-52 and the modified Wilson current mirror 44 produce the high gain and low input offset voltage for input stage 10.

Continuing with FIG. 2, output stage 72 is responsive to the potential developed at the emitter of transistor 98, one $V_{bc}$ less than node 46, for providing a rail-to-rail output signal for the operational amplifier. An upper drive circuit 102 pulls output terminal 104 in the direction of the positive power supply rail, while lower drive circuit 106 enables output terminal 104 to be pulled in the direction of the negative power supply rail.

Drive circuit 106 includes transistor 110 having a base coupled to the emitter of transistor 98 and an emitter coupled through resistor 112 to power supply conductor 34. The collector of transistor 110 is coupled to the emitter of transistor 114 and to the base of transistor 116. Diodes 118 and 120 are serially coupled with resistor 122 between the base of transistor 114 and power supply conductor 34. A typical value for resistor 122 is 680 ohms. Transistor 114 also includes a collector coupled to power supply conductor 28, while the emitter of transistor 116 is coupled to power supply conductor 34.

The base of transistor 110 is also coupled to the bases of transistors 124 and 126. The emitter of transistor 124 is coupled to power supply conductor 34, and capacitor 130 is coupled between the collector and base of transistor 126 for compensation. The first emitter of transistor 126 is coupled to power supply conductor 34, and the second emitter is coupled to node 46, while its collector is coupled to output terminal 104 and through capacitor 134 to node 46. Capacitor 134 provides a dominant pole for loop compensation. The first emitter of transistor 126 is made a 20× area in comparison with a 2× device for transistor 110 for providing adequate output drive at terminal 104. Transistor 136 and resistor 138 limit the collector current of transistor 126.

Drive circuit 102 includes transistor 140 having an emitter coupled through resistor 141 to power supply conductor 28, a base coupled to current source 142, and a collector coupled to the base of transistor 114. Diode 144 has a cathode coupled to the base of transistor 140 and an anode coupled to the emitter of transistor 146 and through resistor 148 to power supply conductor 28. A typical value for resistor 148 is 200 ohms. The base and collector of transistor 146 are coupled together to the collector of transistor 116 and operate as the input of a current mirror. Resistor 150 is coupled between the emitter of transistor 152 and power supply conductor 28. The bases of transistors 146, 152, 154 and 156 are coupled together. PNP transistor 154 also includes an emitter coupled to power supply conductor 28 and a collector coupled to output terminal 104 and to the emitter of transistor 156. Transistor 154 is made as a 60× device in comparison with a 3× device for transistor 146 for maintaining high beta in the presence of high current drive at terminal 104. The collector of transistor 156 is coupled to node 46. Transistor 158, resistor 160 and diode 162 operate as a current mirror at the collector of transistor 152 for limiting the current flow through transistor 154.

For a quiescent operating condition, the potential at node 46 enables transistor 98 to develop a base voltage for transistors 110 and 126. Transistor 116 conducts current through transistor 146 and provides base current for transistor 154. Current supply 142 conducts current through diode 144, thereby developing a base voltage for transistor 140 to conduct current through diodes 118 and 120 and resistor 122. Diode 144 has a fixed voltage drop of say 700 mv.

In the voltage follower configuration of the operational amplifier of FIG. 2, when the potential at node 46 falls in response to an increasing input signal at terminal 14, the base voltage of transistors 110 and 126 decreases and each conduct less current. The voltage at the base of transistor 116 increases as does the current through transistor 146. Transistor 154 also conducts more current as transistor 146 draws more current from its base, and the potential across resistor 148 increases and develops a greater $V_{be}$ and more collector current for transistor 140. The output signal at terminal 104 increases in the direction of the positive power supply rail as transistor 154 sources more current.

With more current flowing through transistor 140, the $V_{be}$ of transistors 114 and 116 increase since the voltage drop across resistor 122 increases. This boosts the current through transistor 116 and the base drive of transistor 154. Thus, as node 46 falls, the output drive boost feedback signal through transistors 110, 116, 146, 140 and 114 and diodes 144, 118 and 120 increases the base drive of transistor 154 to pull terminal 104 in the direction of power supply conductor 28.

Conversely, when the potential at node 46 rises in response to a falling input signal at terminal 14, the base voltage of transistors 110 and 126 increases accordingly to draw more current through each. The output voltage at terminal 104 reduces in the direction of power supply conductor 34 as transistor 126 sinks more current. The voltage at the base of transistor 116 falls as does the current through transistor 146. Transistor 154 also conducts less current with less base drive, and the lower potential across resistor 148 decreases the $V_{be}$ of transistor 140. With less current flowing through transistor 140, the base voltages of transistors 114 and 116 decreases and remove base drive from transistor 154 as appropriate. Hence, the output drive for transistor 154 is provided through transistors 116 and 146, as part of the output drive boost feedback circuit, only when needed which save quiescent power consumption.

Transistor 154 includes a saturation protection feature, wherein the $V_{be}$ of transistor 156 becomes forward biased when transistor 154 saturates. Transistor 156 conducts current away from the collector of transistor 154 and sources current into node 46 to increase the base voltage of transistor 110 and decreases the drive signal for transistor 154 through transistor 116. Likewise, transistor 126 has a second emitter (1× area) coupled to node 46 for providing a saturation protection feature, wherein the second emitter of transistor 126 operates in inverse-active mode to draw current away from node 46 to decrease the base voltage of transistor 126.

Transistor 154 also includes a current limit feature, wherein transistor 152 monitors the base voltage of transistor 154 and activates current mirror circuit 158-162 to sink current from the collector of transistor 140 to reduce the boost feedback signal through transistors 110, 116, 146, 140 and 114 and decrease the output drive for transistor 154. Similarly, transistor 124 monitors the base voltage of transistor 126 and activates circuit 136-138 to source current into the base of transistor 114 which drives transistor 154 harder and ultimately reduces the output drive from transistor 126.

Hence, what has been provided is a novel output stage of an operational amplifier capable of operating between the positive and negative power supply rails.

We claim:

1. In an operational amplifier an input stage responsive to first and second input signals for developing a control signal which is applied to an output stage for providing an output signal of the operational amplifier, the output stage comprising:

a first transistor having a base, an emitter and a collector, said emitter being coupled to a first source of operating potential;

a second transistor having a base, an emitter and a collector, said collector being coupled to said collector of said first transistor for providing the output signal of the operational amplifier, said emitter being coupled to a second source of operating potential, said base being coupled for receiving the control signal from the input stage; and circuit means responsive to the control signal from the input stage for regulating a drive signal applied to said base of said first transistor to allow the output signal of the operational amplifier to swing substantially between said first and second sources of operating potentials, said circuit means including, (a) a third transistor having a collector, a base and an emitter, said base being coupled for receiving the control signal from the input stage, said emitter being coupled to said second source of operating potential, (b) a fourth transistor having a collector, a base and an emitter, said collector being coupled to said first source of operating potential, said base being coupled for receiving a variable bias signal, said emitter being coupled to said collector of said third transistor, (c) a fifth transistor having a collector, a base and an emitter, said base being coupled to said collector of said third transistor, said emitter being coupled to said second source of operating potential, and (d) a sixth transistor having a collector, a base and an emitter, said base and collector being coupled together to said collector of said fifth transistor and to said base of said first transistor for providing said drive signal thereto, said emitter being coupled to said first source of operating potential.

2. The output stage of claim 1 wherein said circuit means further comprises:

a first resistor coupled between said emitter of said sixth transistor and said first source of operating potential;

a first diode having an anode coupled to said emitter of said sixth transistor and having a cathode;

a seventh transistor having having a collector, a base and an emitter, said base being coupled to said cathode of said first diode, said emitter being coupled to said first source of operating potential, said collector being coupled to said base of said fourth transistor; and current supply means having an output coupled to said base of said seventh transistor for sinking a current of predetermined magnitude therefrom.

3. The output stage of claim 2 wherein said circuit means further comprises:

a second diode having a cathode and having an anode coupled to said collector of said seventh transistor and to said base of said fourth transistor for developing said variable bias potential;

a third diode having an anode coupled to said cathode of said second diode and having a cathode;

a second resistor coupled between said cathode of said third diode and said second source of operating potential; and a third resistor coupled between said emitter of said third transistor and said second source of operating potential.

4. An output stage of an operational amplifier, comprising:

a first transistor having a base, an emitter and a collector, said emitter being coupled to a first source of operating potential;

a second transistor having a base, an emitter and a collector, said collector being coupled to said collector of said first transistor for providing an output signal of the operational amplifier, said emitter being coupled to a second source of operating potential, said base being coupled for receiving an input signal applied to the output stage;

a third transistor having a collector, a base and an emitter, said base being coupled for receiving said input signal, said emitter being coupled to said second source of operating potential;

a fourth transistor having a collector, a base and an emitter, said collector being coupled to said first source of operating potential, said base being coupled for receiving a variable bias signal, said emitter being coupled to said collector of said third transistor;

a fifth transistor having a collector, a base and an emitter, said base being coupled to said collector of said third transistor, said emitter being coupled to said second source of operating potential; and a sixth transistor having a collector, a base and an emitter, said emitter being coupled to said first source of operating potential, said base and collector being coupled together to said collector of said fifth transistor and to said base of said first transistor for providing a drive signal thereto allowing the output signal of the operational amplifier to swing substantially between said first and second sources of operating potentials.

5. The output stage of claim 4 further comprising:

a first resistor coupled between said emitter of said sixth transistor and said first source of operating potential;

a first diode having an anode coupled to said emitter of said sixth transistor and having a cathode;

a seventh transistor having having a collector, a base and an emitter, said base being coupled to said cathode of said first diode, said emitter being coupled to said first source of operating potential, said collector being coupled to said base of said fourth transistor; and current supply means having an output coupled to said base of said seventh transistor for sinking a current of predetermined magnitude therefrom.

6. The output stage of claim 5 further comprising:

a second diode having a cathode and having an anode coupled to said collector of said seventh transistor and to said base of said fourth transistor for developing said variable bias potential;

a third diode having an anode coupled to said cathode of said second diode and having a cathode;

a second resistor coupled between said cathode of said third diode and said second source of operating potential; and a third resistor coupled between said emitter of said third transistor and said second source of operating potential.

7. An integrated operational amplifier including an input stage responsive to first and second input signals for developing a control signal which is applied to an output stage for providing an output signal of the operational amplifier, the output stage comprising:

a first transistor having a base, an emitter and a collector, said emitter being coupled to a first source of operating potential;

a second transistor having a base, an emitter and a collector, said collector being coupled to said collector of said first transistor for providing the output signal of the operational amplifier, said emitter being coupled to a second source of operating potential, said base being coupled for receiving the control signal from the input stage; and circuit means responsive to the control signal from the input stage for regulating a drive signal applied to said base of said first transistor to allow the output signal of the operational amplifier to swing substantially between said first and second sources of operating potentials, said circuit means including, (a) a third transistor having a collector, a base and an emitter, said base being coupled for receiving the control signal from the input stage, said emitter being coupled to said second source of operation potential, (b) a fourth transistor having a collector, a base and an emitter, said collector being coupled to said first source of operating potential, said base being coupled for receiving a variable bias signal, said emitter being coupled to said collector of said third transistor, (c) a fifth transistor having a collector, a base and an emitter, said base being coupled to said collector of said third transistor, said emitter being coupled to said second source of operating potential, and (d) a sixth transistor having a collector, a base and an emitter, said base and collector being coupled together to said collector of said fifth transistor and to said base of said first transistor for providing said drive signal thereto, said emitter being coupled to said first source of operating potential.

8. The output stage of claim 7 wherein said circuit means further comprises:

a first resistor coupled between said emitter of said sixth transistor and said first source of operating potential;

a first diode having an anode coupled to said emitter of said sixth transistor and having a cathode;

a seventh transistor having having a collector, a base and an emitter, said base being coupled to said cathode of said first diode, said emitter being coupled to said first source of operating potential, said collector being coupled to said base of said fourth transistor; and current supply means having an output coupled to said base of said seventh transistor for sinking a current of predetermined magnitude therefrom.

9. The output stage of claim 8 wherein said circuit means further comprises:

a second diode having a cathode and having an anode coupled to said collector of said seventh transistor and to said base of said fourth transistor for developing said variable bias potential;

a third diode having an anode coupled to said cathode of said second diode and having a cathode;

a second resistor coupled between said cathode of said third diode and said second source of operating potential; and a third resistor coupled between said emitter of said third transistor and said second source of operating potential.

* * * * *